United States Patent [19]

Naujoks

[11] Patent Number: 5,714,888
[45] Date of Patent: Feb. 3, 1998

[54] METHOD AND APPARATUS FOR TESTING ELECTRONIC CIRCUITRY IN A MANUFACTURING ENVIRONMENT

[75] Inventor: Adolph C. Naujoks, Coral Springs, Fla.

[73] Assignee: Motorola, Inc., Schaumburg, Ill.

[21] Appl. No.: 578,406

[22] Filed: Dec. 26, 1995

[51] Int. Cl.$^6$ .................................................. G01R 31/308
[52] U.S. Cl. .................................................. 324/750; 324/501
[58] Field of Search ..................................... 324/750, 158.1, 324/639, 538, 501

[56] References Cited

U.S. PATENT DOCUMENTS

| | | | |
|---|---|---|---|
| 4,876,656 | 10/1989 | Leicht et al. | 364/491 |
| 5,218,294 | 6/1993 | Soiferman | 324/538 |
| 5,424,633 | 6/1995 | Soiferman | 324/538 |
| 5,517,110 | 5/1996 | Soiferman | 324/538 |

Primary Examiner—Ernest F. Karlsen
Attorney, Agent, or Firm—Andrew S. Fuller

[57] ABSTRACT

A manufacturing environment(100) includes test equipment (130) that tests circuitry (110) for functional operation. An electromagnetic probe (137) is operated adjacent to a substrate having electronic circuitry to be tested (310). The electromagnetic probe is activated to directly stimulate a localized portion of the electronic circuitry with a wireless signal (320). Functional operation of the circuitry is determined by measuring the response of the electronic circuitry (330, 340). In one embodiment, an array of electromagnetic probes is operated to receive near-field electromagnetic emissions emanating from the circuitry. These emissions are measured and an electromagnetic profile generated for a portion of the circuitry (330). The electromagnetic profile is analyzed to determine functional operation of the circuitry (340).

15 Claims, 4 Drawing Sheets ent and must be repeatable to be effective. As circuit assemblies are miniaturized, additional contact accuracy is required and the potential for damage from misaligned contacts is increased.

METHOD AND APPARATUS FOR TESTING ELECTRONIC CIRCUITRY IN A MANUFACTURING ENVIRONMENT

TECHNICAL FIELD

This invention relates in general to manufacturing processes, and in particularly, to testing of electronic circuitry in a manufacturing environment.

BACKGROUND

Electronic products comprising circuit assemblies are often manufactured in factories having a high level of automation. Such factories typically employ process control and product testing in order to ensure high quality, fully functional products. A product may be tested at various stages of manufacture. For example, testing may be performed on a sub-assembly of components, a functional module, or a fully integrated product.

The prior art teaches various methods of testing in a manufacturing environment using a variety of manual and automated test equipment. These methods include visual inspection, and functional testing. Visual inspections tend to yield information on whether or not components were properly placed on a circuit board and may identify some instances where electrical connections were not properly made. Functional testing typically yields more comprehensive information, as the various components in an electrical module must be connected and operational to pass a particular functional test. Automated functional testing is commonly performed on circuit assemblies which are sufficiently integrated to enable a particular function.

In a typical functional test of a circuit assembly, an interface is established, such as by a connector or mechanical test probe, with an interface on the circuit assembly under test. The circuitry being test is then stimulated and its responses measured. A circuit design that supports functional testing can add significant complexity, cost, and size to a particular circuit assembly. For example, an interface to support a mechanical test probe or connector must be accommodated. Furthermore, signals may have to be routed from particular areas from which test results are required to the test interface. The additional signal lines to the test interface, and the test interface itself consumes valuable space that may be otherwise available for placing components or additional circuitry.

Various methods of establishing contact between test equipment and a circuit assembly under test are known. One widely used approach involves the use of a bed of nails in a test platform. Here, a physical connection between the test equipment and the circuit assembly is established using a spring loaded pin to each point of the circuit to be monitored or measured. The contact pins vary in size, shape, and contact pressures. The bed of nails contacting platform requires substantial maintenance. Exposure to airborne contaminates, and accumulation of debris from repeated contact operations, usually cause the contact quality to degrade, thereby resulting in variability in test measurements. Variability in mechanical contacts generally result in measurement errors, particularly at high frequencies of circuit operation.

Another problem with prior art functional testing is the potential damage to components that may be caused when interfacing the test equipment with the circuitry under test. Care must be taken to properly align the test contacts with the test interface in order to avoid such damage. Alignment must be precisely controlled and must be repeatable to be effective. As circuit assemblies are miniaturized, additional contact accuracy is required and the potential for damage from misaligned contacts is increased.

It is desirable to provide automated testing of circuit boards in a variety of manufacturing applications. Preferably, such testing is as non-invasive as possible in order to reduce potential damage to the circuitry being tested. Additionally, it is desirable to provide such functionality testing without the addition of costly, complex, and space consuming circuitry. Accordingly, a new approach to the automated testing of circuit boards is needed.

DETAILED DESCRIPTION OF THE PREFERRED EMBODIMENT

Generally, the present invention provides a method of testing circuitry for functional operation in a manufacturing environment. An electromagnetic probe is operated adjacent to a substrate having electronic circuitry to be tested. The electromagnetic probe is activated to directly stimulate a localized portion of the electronic circuitry with a wireless signal. Functional operation of the circuitry is determined by measuring the response of the electronic circuitry. In a preferred embodiment, an array of electromagnetic probes is operated to receive near-field electromagnetic emissions emanating from the circuitry. These emissions are measured and an electromagnetic profile generated for a portion of the circuitry. The electromagnetic profile is analyzed to determine functional operation of the circuitry.

Figure 1:
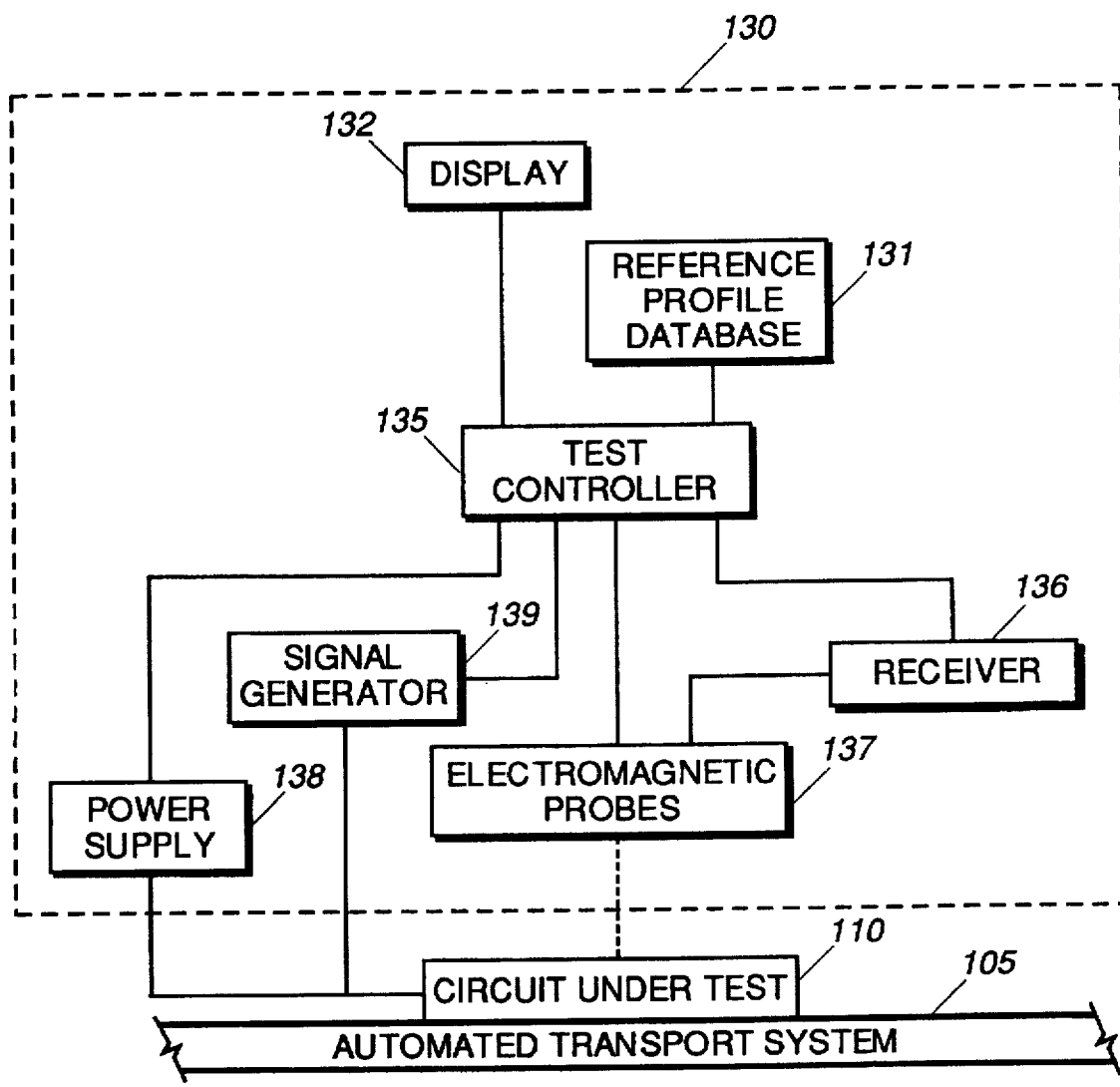
FIG. 1 is a block diagram of an automated test environment, in accordance with the present invention.
Figure 2:
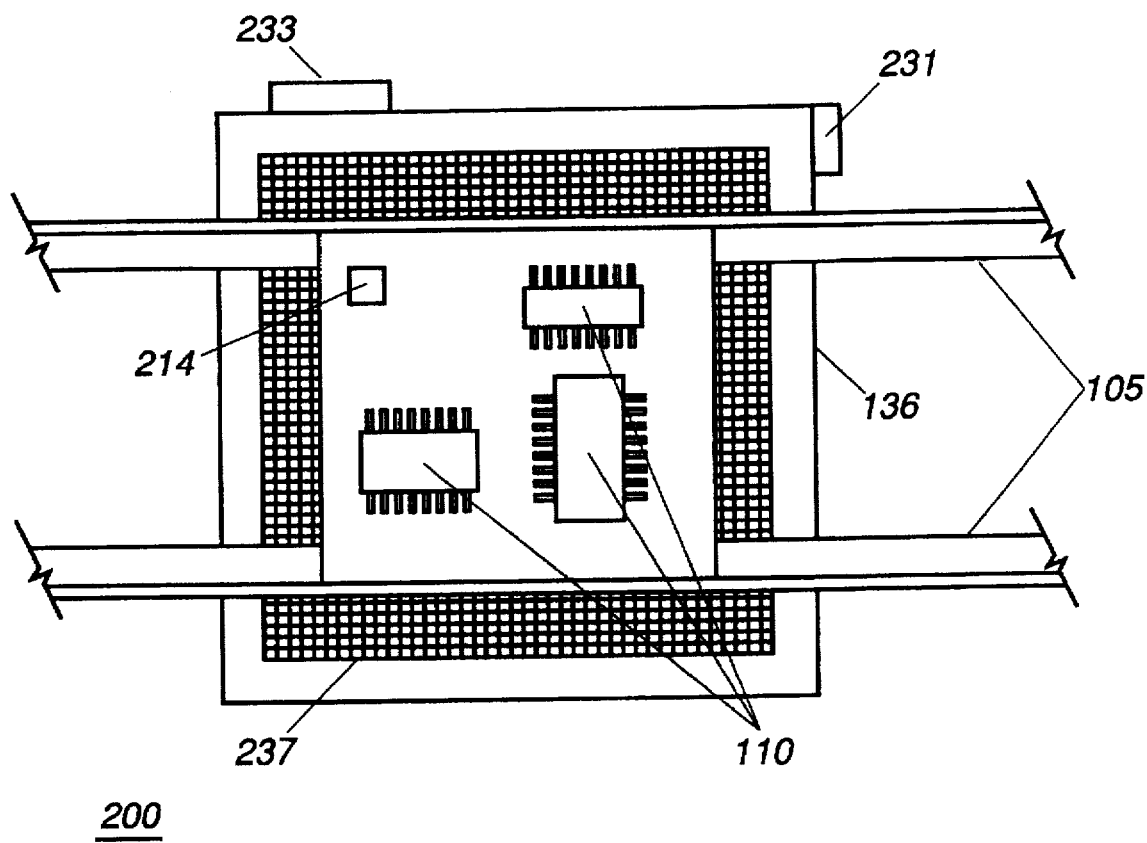
FIG. 2 is a fragmentary view of the automated test environment highlighting interaction between automated test equipment and a circuit under test, in accordance with the present invention.

FIG. 1 is a block diagram of an automated test environment 100, in accordance with the present invention. FIG. 2 is a fragmentary view of the automated test environment highlighting interaction between automated test equipment and a circuit under test, in accordance with the present invention. Referring to FIGS. 1 and 2, the test environment 100 includes automated test equipment (ATE) 130 that interfaces with circuitry under test (C.U.T.) 110 carried by an automated transport system 105. The C.U.T. 110 comprises a circuit substrate having electronic and other electrical components assembled in a circuit, thereby forming a functional module. The C.U.T. 110 is carried by the automated transport system 105, which can be implemented using a conveyor system, a robotic conveyance system, or the like. The automated transport system 105 automatically positions the C.U.T. 110 at the ATE 130.

The ATE 130 includes a test controller 135 that provides operational control of the test environment. A display 132 coupled to the test controller 135 provides a user interface to facilitate control or monitoring of the ATE 130. The test controller 135 has coupled thereto a reference profile database 131, a receiver 136, a signal generator 139, electromagnetic probes 137, and a power supply 138. In the preferred embodiment the test controller 135 is a computing device having automated test software operating thereon. Such configuration is well known in the art for controlling the sequencing of tests, the storage of test results, and for controlling the interface between the ATE 130 and the C.U.T. 110. The test controller 135 interfaces with the reference profile database 131 in performing its tests in accordance with the present invention. The database 131 can be implemented using a relational database management system commonly available from a variety of vendors. The database 131 stores information needed to characterize measurement data taken from the C.U.T. 110.

The C.U.T. is activated and tested at the ATE 130. The power supply 138 provides power to activate the C.U.T. 110 via a port 214 on the C.U.T. 110. According to the present invention, the ATE 130 operates to inject stimulus signals into the powered C.U.T. 110, and to receive and analyze electromagnetic emissions to determine circuit functionality. The test controller 135 interfaces with the C.U.T. 110 via the electromagnetic probes 137. The electromagnetic probes 137 are preferably arranged in an array on a planar panel 237. Operational control of the panel 237 is provided by the test controller via port 233. Preferably, the probes 137 of the panel 237 do not physically interface with the C.U.T. 110.

In the preferred embodiment, the electromagnetic probes 137 are formed from a planar array of miniature H-field probes arranged in a grid pattern. These H-field probes are used as near-field antennas. At least some of the probes can be selectively activated to sample the electromagnetic field over its direct location. The probes are approximately 7.6 millimeters apart, and the active area of the panel covers approximately 24.4 by 30.5 centimeters. A panel of H-field probes is available as a scanner/sensor panel under the EMSCAN™ brand from the Northern Telecom Company of Canada. Such a probe panel is further configured, according to the present invention, such that at least some of the probes can be selectively activated to transmit a low intensity near-field radio frequency emission in a highly localized area. These probes are operable across a frequency range of 10 MHz to 1.5 GHz.

The stimulus signals are generated by the signal generator 139 and injected into the circuitry to activate localized portions of the circuitry. The signal generator 139 is operable to generate radio frequency signals corresponding to the operating frequencies of the various portions of the circuitry to be stimulated. Preferably, the signal generator 139 is coupled to one or more of the set of electromagnetic probes 137.

When stimulated, a properly functioning C.U.T. 110 manifests specific measurable characteristic responses. These responses are measured and functional operation of the circuitry determined accordingly. In the preferred embodiment, the responses are detected by the set of electromagnetic probes 137 on the electromagnetic probe panel. Electromagnetic signals detected by the electromagnetic probes 137 are amplified and routed to the receiver 136 via a radio frequency port 231. The receiver 136 is operable to receive radio frequency signals at various frequencies corresponding to the operating frequencies of various portions of the C.U.T. The receiver 136 can be implemented using a spectrum analyzer or similar instrumentation. Preferably, the receiver 136 is coupled to one or more of the array of electromagnetic probes 137.

Figure 3:
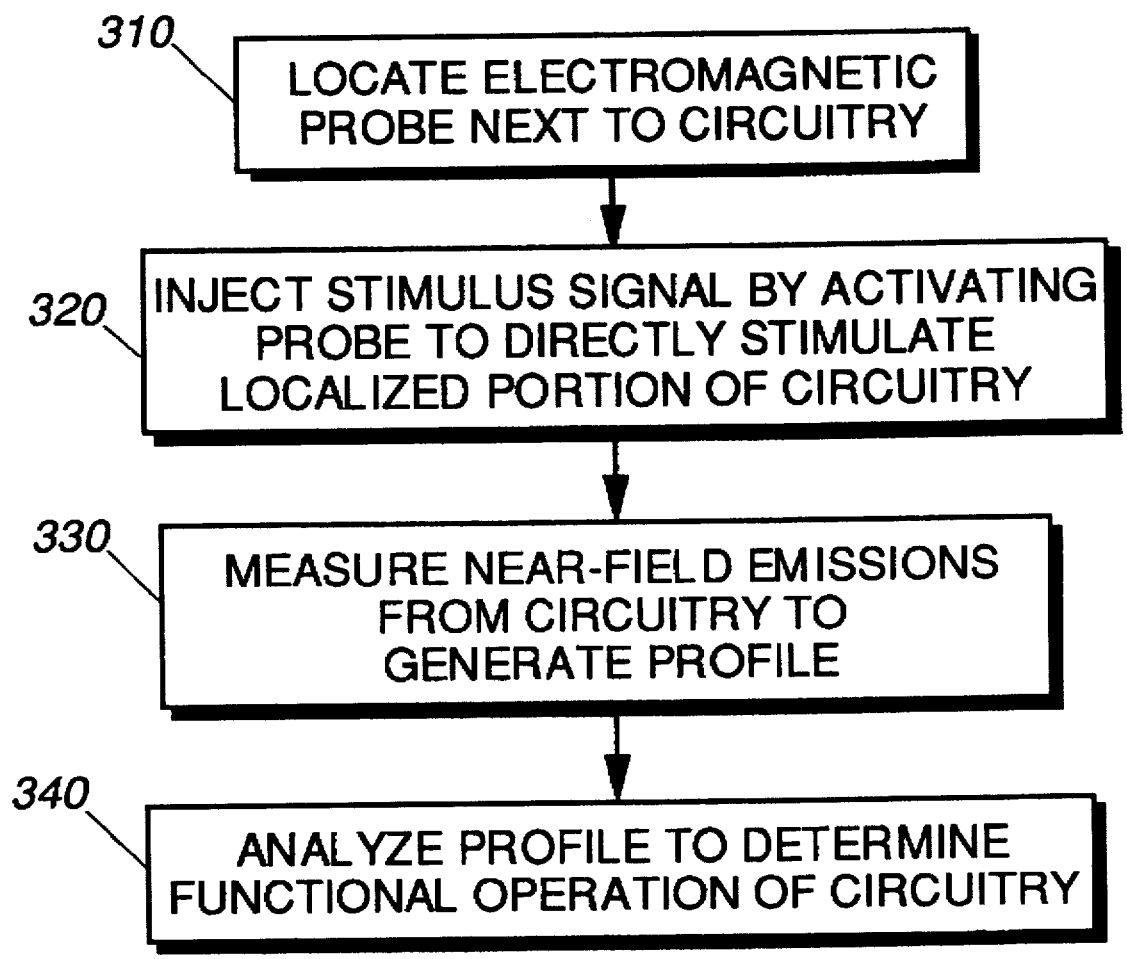
FIG. 3 is a flow chart of procedures for automated testing of an electronic circuit, in accordance with the present invention.

Referring to FIG. 3, a flowchart of procedures for automated testing of electronic circuitry is shown, in accordance with the present invention. Upon test initiation, an electromagnetic probe is located within close proximity of the circuitry being tested, step 310. In the preferred embodiment, a circuit substrate carrying the circuitry is automatically located using an automated conveyor transport system such that an array of electromagnetic probes is located adjacent to the circuit substrate. The circuitry being tested is then activated. Preferably, power is applied to a power supply port on the circuit substrate that enables or activates the circuitry, or at least a portion of the circuitry. When activated, various portions of the circuitry operate at a predetermined operating frequency which results in radio frequency emissions.

A stimulus signal is injected to activate or stimulate a localized portion of the circuitry, step 320. Preferably, an electromagnetic probe is activated and used to transmit a near-field wireless emission that directly stimulates the localized area of the circuitry. Multiple points of stimulation are provided as needed by simultaneously operating multiple probes to transmit near-field emissions at the various localized portions of the circuitry. In the preferred embodiment, at least one of the array of electromagnetic probes is selectively activated to transmit the near-field transmission. Ordinarily, the electromagnetic probe closest to the localized portion of the circuitry is selected, and a signal source coupled to this probe. The signal source provides a radio frequency signal corresponding to the operating frequency of the localized portion of circuitry.

The present invention provides for circuit stimulation that is particular useful for diagnosing circuitry having non-functional elements, or portions of circuitry. For example, a near-field emission can be transmitted to stimulate a localized portion of circuitry to substitute for the output of a non-functional portion of circuitry. Consequently, diagnosis of circuitry can proceed despite the presence of non-functional elements. This approach is also useful for testing little used portions of circuitry.

After activation and/or stimulation, functional operation the circuitry is determined by measuring and analyzing the circuitry's response. Measuring is preferably accomplish in a non-invasive manner, i.e., without physically interfacing to the circuitry. In the preferred embodiment, an array of electromagnetic probes is operated adjacent to the circuitry to selectively receive near-field electromagnetic emissions emanating from the circuitry when activated by the stimulus signal. The electromagnetic emissions received by the electromagnetic probes are measured to generate an electromagnetic profile of at least a portion of the circuitry, step 330.

In operation, the test controller determines the operating frequency at a particular portion of the circuitry for which testing is desired. The receiver is programmed to receive this operating frequency from at least some of the electromagnetic probes. The circuitry is then scanned by activating, in turn, each electromagnetic probe to detect near-field electromagnetic emission. The emissions detected are sampled by the receiver. A scan result comprising the output of the receiver is digitized and stored as measurement data at the test controller. Oftentimes, portions of the circuitry may have different operating frequencies. In such cases, a set of frequencies corresponding to the operating frequencies of the portions of circuitry to be tested is selected. The set of frequencies are selectively programmed into the receiver when scanning the corresponding portions of circuitry. A scan result is generated that correspond to each of these frequencies.

The measurement data is used to generate an electromagnetic profile that represents localized areas of electromagnetic emissions. The profile may consist of a few data points or may encompass complex data, such as can be used for pattern recognition. The electromagnetic profile is analyzed to determine functional operational of the circuitry. This scan result is then analyzed to determine functional operation of at least a portion of the circuitry, step 340. Preferably, a reference electromagnetic profile is retrieved from a database of reference profiles that corresponds to the type of circuitry under test. The reference profile comprises radio frequency emission information compiled by scanning circuitry from a reference circuit substrate. Information derived from the reference profile is compared with the electromagnetic profile from the scan result of the circuitry under test.

A pass/fail determination is made on the basis of the comparison between the electromagnetic profile determined from the acquired scan result and the reference profile. Optionally, a visual representation of electromagnetic emission levels is presented on the display coupled to the test controller. For display purposes, the acquired data is used to develop a map showing the field emission pattern of the circuit substrate. The strength of scanned signals is represented, such as by overlaying shading, color, or patterns. An outline drawing of the circuit substrate and circuitry is then superimposed or otherwise combined with the emissions map and displayed.

Figure 4:
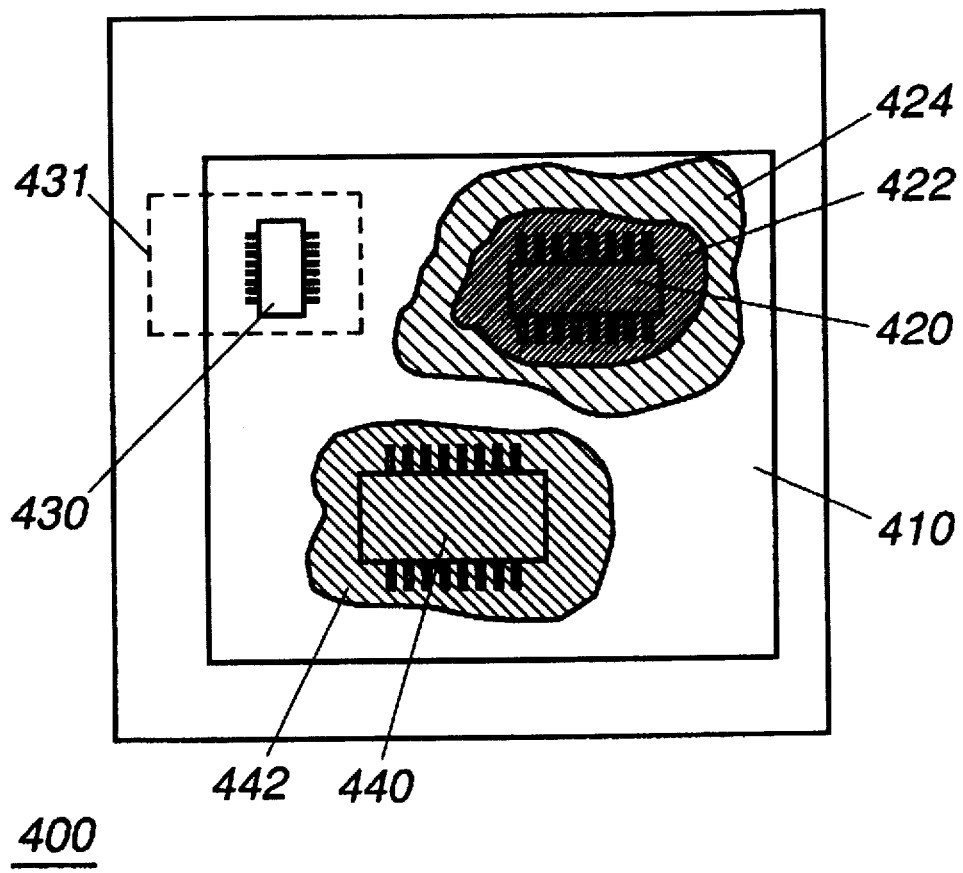
FIG. 4 is a block diagram of a display having a visual representation of electromagnetic inspection of a printed circuit board, in accordance with the present invention.

FIG. 4 is a block diagram 400 of a display having a visual representation of electromagnetic inspection of a printed circuit board, in accordance with the present invention. The display 132 has an outline of a circuit board 410, and circuitry including circuit components 420, 430, 440. In this example, electromagnetic emissions were expected in the area 431 corresponding to the component 430. However, none was found which would indicate a potential problem with the component 430. For component 420, a larger than expected RF emission is represented by areas 422 and 424. This may indicate a problem at or near component 420. For component 440, the expected RF emission is represented by a area 442, thereby indicating normal operation.

The present invention provides significant advantages over the prior art. Electronic circuitry can be stimulated at selected points and circuit response measured without the need for a physical test interface between the test equipment and the circuitry. Signal lines or connectors specifically included on prior circuit boards for test purposes can be reduced or eliminated. As a result, the cost, size, and complexity of the circuit board can be reduced. However, the flexibility for testing and diagnosis is increased.

What is claimed is:

1. In a manufacturing environment, a method of testing circuitry, comprising the steps of:
    locating an array of electromagnetic probes in close proximity to the circuitry, each of the array of electromagnetic probes being selectable to receive electromagnetic emissions emanating from the circuitry when activated by a stimulus signal;
    activating a particular electromagnetic probe, selected from the array of electromagnetic probes, to directly stimulate a localized portion of the circuitry with a wireless signal; and
    determining functional operation of the circuitry by measuring a response from the circuitry.

2. The method of claim 1, wherein the step of activating the particular electromagnetic probe comprises the step of
    transmitting, from the particular electromagnetic probe to the circuitry, a near-field emission that directly stimulates the localized portion of the circuitry.

3. The method of claim 1, wherein the step of activating comprises the step of
    selecting an electromagnetic probe from the array of electromagnetic probes that is closest to the localized portion.

4. The method of claim 1, wherein the step of transmitting comprises the step of
    coupling a signal source to the particular electromagnetic probe, the signal source providing radio signal corresponding to an operating frequency of the localized portion of circuitry.

5. The method of claim 2 wherein the step of transmitting comprises the step of
    transmitting the near-field emission to stimulate the localized portion to substitute for output of a non-functional portion of the circuitry.

6. The method of claim 2, wherein the step of transmitting comprises the step of
    simultaneously operating a plurality of electromagnetic probes, selected from the array of electromagnetic probes, to transmit near-field emissions at various localized portions of the circuitry.

7. The method of claim 1, wherein the step of determining functional operation, comprises the steps of:
    measuring near-field electromagnetic emissions from the circuitry, using at least some electromagnetic probes of the array of electromagnetic probes, to generate an electromagnetic profile of at least a portion of the circuitry; and
    analyzing the electromagnetic profile to determine functional operational of the circuitry.

8. The method of claim 7, wherein the step of measuring comprises the step of
    activating a plurality of electromagnetic probes in turn to receive electromagnetic emissions from the circuitry.

9. The method of claim 8, wherein the step of analyzing comprises the steps of:
    retrieving a reference profile from a database; and comparing the electromagnetic profile to the reference profile.

10. The method of claim 1, further comprising the step of measuring near-field electromagnetic transmissions from the circuitry using the particular electromagnetic probe when not in use for stimulation.

11. The method of claim 1, wherein the array of electromagnetic probes is situated on a planar panel.

12. A method of testing circuitry, comprising the steps of:
    locating an array of electromagnetic probes in close proximity to the circuitry, each of the array of electromagnetic probes being selectable to receive electromagnetic emissions emanating from the circuitry when the circuitry is activated by a stimulus signal, each of the array of electromagnetic probes being selectable to transmit a stimulus signal for the circuitry;
    activating a particular electromagnetic probe, selected from the array of electromagnetic probes, to directly stimulate a localized portion of the circuitry with a wireless signal; and
    determining functional operation of the circuitry by measuring a response from the circuitry, via at least some of the array of electromagnetic probes.

13. The method of claim 12, wherein the step of activating comprises the step of
    selecting an electromagnetic probe from the array of electromagnetic probes that is closest to the localized portion.

14. The method of claim 13 wherein the step of activating comprises the step of transmitting the near-field emission to stimulate the localized portion to substitute for output of a non-functional portion of the circuitry.

15. A method of testing circuitry, comprising the steps of:

locating an array of electromagnetic probes in close proximity to the circuitry, each of the array of electromagnetic probes being selectable to receive electromagnetic emissions emanating from the circuitry when the circuitry is activated by a stimulus signal, each of the array of electromagnetic probes being selectable to transmit a stimulus signal for the circuitry;

simultaneously activating a plurality of electromagnetic probes, selected from the array of electromagnetic probes, to directly stimulate localized portions of the circuitry with a wireless signal;

determining functional operation of the circuitry by measuring a response from the circuitry, via at least some of the array of electromagnetic probes, including the steps of:

measuring near-field electromagnetic emissions from the circuitry, using at least some electromagnetic probes of the array of electromagnetic probes, to generate an electromagnetic profile of at least a portion of the circuitry;

retrieving a reference profile from a database; and comparing the electromagnetic profile to the reference profile.

* * * * *

UNITED STATES PATENT AND TRADEMARK OFFICE
CERTIFICATE OF CORRECTION

PATENT NO. : 5,714,888
DATED : February 3, 1998
INVENTOR(S) : Adolph C. Naujoks

It is certified that error appears in the above-identified patent and that said Letters Patent is hereby corrected as shown below:

Column 3, line 34, after "is" and before "available" insert --commercially --; after "available" and before "a" delete "as" and insert therefor ---in--; after "scanner/sensor" and before "under" delete "panel" and insert therefor --configuration--.

Column 3, lines 34-36, delete "under the EMSCAN™ brand from the Northern Telecom Company of Canada".

Signed and Sealed this

Twenty-second Day of September, 1998

*Attest:*

BRUCE LEHMAN

*Attesting Officer*     *Commissioner of Patents and Trademarks*